(12) United States Patent
Yalcin et al.

(10) Patent No.: US 6,760,894 B1
(45) Date of Patent: Jul. 6, 2004

(54) METHOD AND MECHANISM FOR PERFORMING IMPROVED TIMING ANALYSIS ON VIRTUAL COMPONENT BLOCKS

(75) Inventors: Hakan Yalcin, Fremont, CA (US); Cyrus S. Bamji, Fremont, CA (US); Mohammad S. Mortazavi, Palo Alto, CA (US); Robert J. Palermo, Shoreview, MN (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/173,202

(22) Filed: Jun. 14, 2002

Related U.S. Application Data (63) Continuation-in-part of application No. 09/477,710, filed on Dec. 28, 1999, now Pat. No. 6,457,159.
(60) Provisional application No. 60/298,533, filed on Jun. 15, 2001.

(51) Int. Cl.$^7$ .................................... G06F 17/50
(52) U.S. Cl. ............................................ 716/6
(58) Field of Search ......................... 716/1, 4–6, 18, 716/7, 10; 703/19

(56) References Cited

U.S. PATENT DOCUMENTS

| | | | | |
|---|---|---|---|---|
| 5,404,311 A | * | 4/1995 | Isoda ............................ | 703/19 |
| 5,475,605 A | * | 12/1995 | Lin ............................... | 716/18 |
| 5,475,607 A | * | 12/1995 | Apte et al. ...................... | 716/6 |
| 5,572,717 A | * | 11/1996 | Pedersen ......................... | 716/6 |
| 5,764,531 A | * | 6/1998 | Kojima et al. ................... | 716/6 |
| 6,175,946 B1 | | 1/2001 | Ly et al. | |
| 6,209,122 B1 | * | 3/2001 | Jyu et al. ........................ | 716/6 |
| 6,253,361 B1 | | 6/2001 | Buch | |
| 6,324,678 B1 | * | 11/2001 | Dangelo et al. ............... | 716/18 |
| 6,604,227 B1 | * | 8/2003 | Foltin et al. ..................... | 716/6 |

OTHER PUBLICATIONS

Brand, D. et al., "Timing Analysis Using Functional Analysis," Transactions on Computers, vol. 37, No. 10, Oct. 1988.
Brand, D. et al., "Timing Analysis Using Functional Relationships." Proceedings International Conference on Computer–Aided Design, 1986, pp. 126–129.
Chen, H.–C. et al., "Path Sensitization in Critical Path Problem," IEEE Transactions on Computer–Aided Design of Integrated Circuits and Systems, vol. 12, No. 2, Feb. 1993.
Gersho, A. et al., "Vector Quantization and Signal Compression," *Kluwer Academic Publishers*, 1992.
Hakan, Y. et al., "Functional Timing Analysis for IP Characterization," Proceedings 1999 Design Automation Conference, Jun. 1999, pp. 731–736.
Hrapcenko, V.H., "Depth and Delay in a Network," *Soviet Math Dokl.*, vol. 19, 1978, pp. 1006–1009.

(List continued on next page.)

*Primary Examiner*—Matthew Smith
*Assistant Examiner*—Paul Dinh
(74) *Attorney, Agent, or Firm*—Bingham McCutchen LLP (57) ABSTRACT

A method and mechanism for performing a timing analysis on virtual component blocks, which is an abstraction of a circuit block is provided. A set of modes for a circuit block are identified, where a mode is a set of meaningful control input values. Each functionally meaningful or useful control input combination is applied to the circuit block. For each control input combination applied, a delay for each data input/output path and each control input/output path not passing through a blocked circuit node for the applied combination of control inputs is calculated. The delay information for the data paths and control paths is stored within a timing model. The delay information may include a maximum or minimum delay for the circuit block. The timing of sequential circuit blocks may also characterized using the methods and mechanisms herein.

48 Claims, 9 Drawing Sheets

OTHER PUBLICATIONS

Kukimoto, Y. et al., "Approximate Timing Analysis of Combinational Circuits Under the XBDO Model," Proceedings International Conference on Computer–Aided Design, 1997, pp. 176–181.

Kukimoto, Y. et al., "Hierachical Functional Timing Analysis," Proceedings Design Automation Conference, 1998, pp. 580–585.

McGeer, P.C., et al., "Integrating Functional and Temporal Domains in Logic Design; the False Path Problem and its Implications," *Kluwer Academic Publishers*, Boston, 1991, pp. 29–95.

McWilliams, T.M., "Verification of Timing Constraints on Large Digital Systems," Proceedings Design Automation Conference, 1980, pp. 139–147.

Silva, J.P.M., et al., "Efficient and Robust Test Generation–Based Timing Analysis," Proceedings International Symposium on Circuits and Systems, 1994.

Venkatesh, S.V., et al., "Timing Abstraction of Intellectual Property Blocks," Proceedings Custom Integrated Circuits Conference, 1997, pp. 99–102.

Yalcin, H., et al. "An Approximate Timing Analysis Method for Datapath Circuits," Proceedings International Conference on Computer–Aided Design, 1986, pp. 114–118.

Yalcin, H., et al., "Hierarchical Timing Analysis Using Conditional Delays," Proceedings International Conference on Computer–Aided Design, 1995, pp. 371–377.

* cited by examiner

| a | b | z |
|---|---|---|
| 0 | 0 | 0 |
| 0 | 1 | 1 |
| 1 | 0 | 1 |
| 1 | 1 | 1 |
| 0 | X | X |
| X | 0 | X |
| 1 | X | 1 |
| X | 1 | 1 |
| X | X | X |

FIG. 4

Table 1: Viability and safe static propagation conditions for an AND gate.

| $V_x$ | $V_y$ | Viability | | Safe static* | |
|---|---|---|---|---|---|
| | | COND(x,z) | COND(y,z) | COND(x,z) | COND(y,z) |
| 0 | 0 | $t_x \leq t_y$ | $t_x \leq t_y$ | 1 | 0 |
| 0 | 1 | 1 | $t_x \leq t_y$ | 1 | 0 |
| 0 | U | 1 | $t_x \leq t_y$ | 1 | 0 |
| 1 | 0 | $t_x \leq t_y$ | 1 | 0 | 1 |
| 1 | 1 | 1 | 1 | 1 | 1 |
| 1 | U | 1 | 1 | 1 | 1 |
| U | 0 | $t_x \leq t_y$ | 1 | 0 | 1 |
| U | 1 | 1 | 1 | 1 | 1 |
| U | U | 1 | 1 | 1 | 1 |

*: The conditions of safe scale are not symetric between x and y inputs

| Path | C = 0 | C = 1 |
|---|---|---|
| A => Z: | 6 | 3 |
| B => Z: | 2 | none |
| C => Z: | 4 | 5 |

METHOD AND MECHANISM FOR PERFORMING IMPROVED TIMING ANALYSIS ON VIRTUAL COMPONENT BLOCKS

RELATED APPLICATION DATA

This application is a continuation-in-part application of U.S. application Ser. No. 09/477,710 filed on Dec. 28, 1999, now U.S. Pat. No. 6,457,159, and this application also claims priority to U.S. provisional application Serial No. 60/298,533 filed on Jun. 15, 2001, both of which are incorporated herein by reference in their entirety.

FIELD OF THE INVENTION

The field of the present invention relates to electronic design automation and, more particularly, to methods and mechanisms for performing improved timing analysis upon electronic circuit blocks.

BACKGROUND AND SUMMARY OF THE INVENTION

Advances in silicon technology increasingly allow larger and more complex designs to be formed on a single chip. Designs may consist of millions or tens of millions of transistors on a single chip. At the same time, however, market demands continue to push designers to develop designs more rapidly and efficiently. A recent trend to increase design speed and efficiency involves the re-use or recycling of electronic circuit models of circuit blocks (which may have one or more subsystems), which are commonly referred to as "cores" or "IPs" (for "Intellectual Properties"). Once the design for a circuit block has been tested and verified, it can be re-used in other applications which may be completely distinct from the application which led to its original creation. For example, a subsystem for a cellular phone ASIC may contain a micro-controller as well as a digital signal processor and other components. After the design for the cellular phone subsystem has been tested and verified, the circuit block could be re-used in, for example, an automotive application. Design reuse of circuit blocks allows a designer to complete a design much faster than building the entire design from scratch, and avoids the need for debugging, testing and verification of the subsystems embodied circuit block. Circuit blocks may be of various sizes and levels of complexity, and one circuit block may comprise one or more subsystems, where each subsystem is itself a circuit block. A virtual component block shall be used herein to refer to any model or abstract representation of a circuit block.

Timing models may be used to characterize the timing of a circuit block without having access to the actual circuit block once the timing model is constructed. While timing models have been found to be convenient for expediting and simplifying the circuit design process, the successful use of timing models hinges on the ability to accurately characterize their timing and functionality. In analyzing large circuits, it is often necessary to sacrifice some accuracy given the computational complexity involved, e.g., some methods of timing analysis performed on circuits consider false paths. False paths are signal paths that are never sensitized, i.e., activated, in actual operation. While it may be possible to detect false paths, identifying and removing them when undergoing timing analysis on large circuits is much too slow to be of practical value.

A number of techniques have been developed or proposed for performing timing estimation analyses on circuit blocks, including static timing analysis and functional timing analysis. Static timing analysis involves the calculation of a worst-case structural (or topological) delay between a circuit block's input and an output, but ignores the functionality of the circuit block. Static timing analysis methods make no attempt to detect false paths.

Functional timing analysis methods attempt to rely on the fact that the delays in a circuit block are linked to the way a circuit functions. "Functionality" in this context refers to the logical value computed for each node in the circuit block ("circuit node"), given an input vector. Unlike traditional static timing analysis, functional timing analysis uses a circuit block's function as well as its structure to characterize delays and timing constraints.

Two widely used methods for functional timing analysis are symbolic analysis via binary-decision diagrams (BDDs), and boolean search methodologies that systematically enumerate the input space. Both methods assume that the delays of a circuit block depend on the values of all of its inputs. These methods aim at finding an input vector that sensitizes the true longest path. However, they both have the disadvantage that their complexity increases exponentially with circuit size, limiting their applicability, or requiring unacceptably large amounts of computation resources for larger circuit designs.

Figure 1:
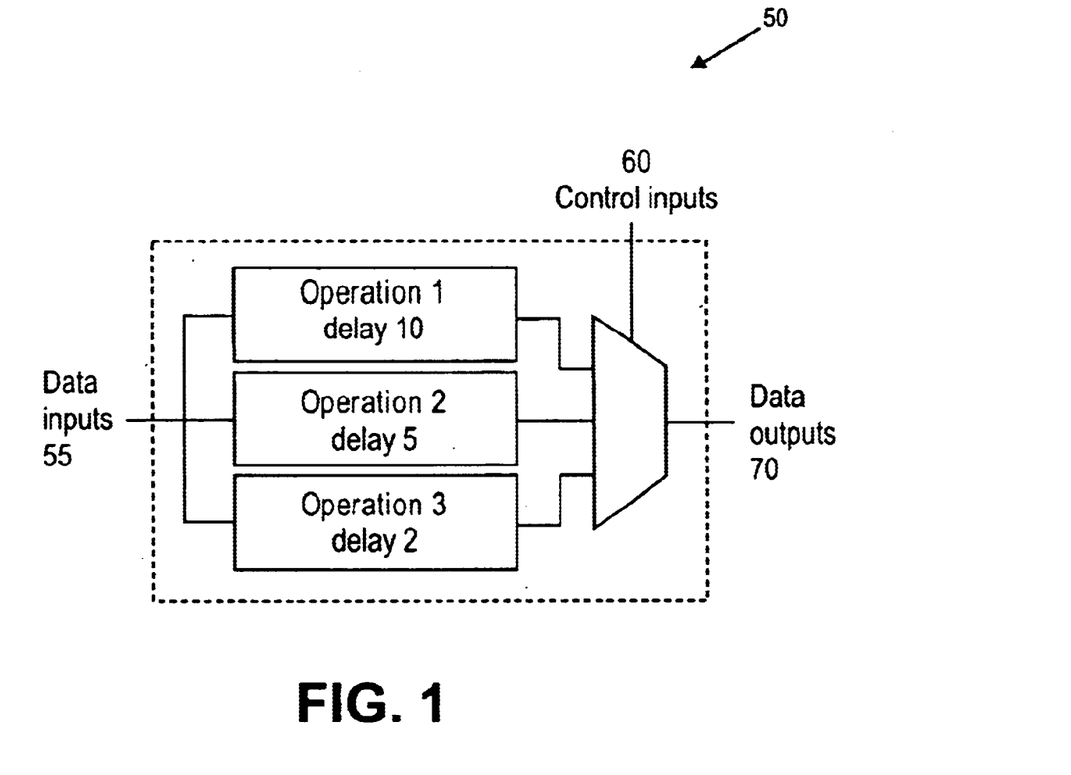
FIG. 1 is a block diagram of a simple circuit illustrating control inputs and data inputs.

A more practical approach is to assume that a circuit block's delay depend on only a subset of its inputs. This is typical of datapath circuits, where a small number of control inputs determine the delays between a large number of data inputs and data outputs. A simple example is shown by a circuit 50 in FIG. 1, wherein the control inputs 60 to a large extent determine the delays between the data inputs 55 and the data outputs 70. For example, if the control inputs 60 sensitize the signal path to enable operation 1, then a delay of 10 is observed, while only a delay of 2 is observed if operation 3 is performed.

Methods of timing analysis have been developed based upon the recognition that the control inputs play a role in determining the delays between the data inputs and outputs. These methods generally trade accuracy for computation efficiency. For example, some static timing analyzers employ a systematic case analysis capability whereby the user sets some inputs to constant values prior to performing the timing analysis. A drawback with such timing analysis methods is that they suffer from delay underestimation. Delay underestimation is a serious problem in circuit design because it can lead to incorrect operation.

One timing analysis benchmark involves calculation of the delay in a so-called "floating mode" of operation. In a floating mode of operation, each circuit node initially has an unknown value. Upon the application of an input vector to the circuit, the circuit node undergoes a series of transitions or events before it eventually stabilizes at a value determined by the circuit's internal static functionality.

Figure 2A:
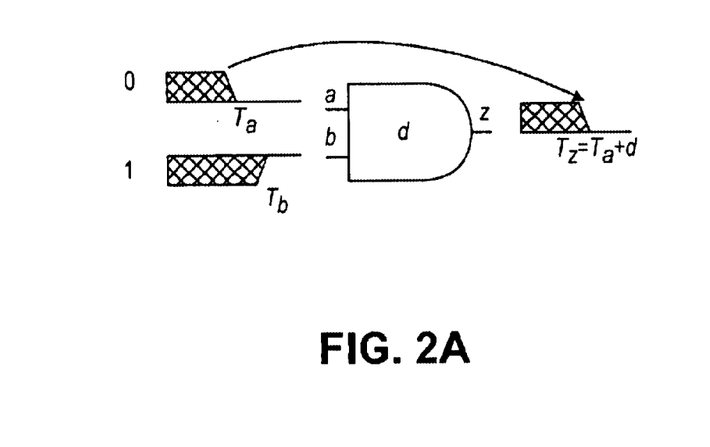
FIG. 2A and FIG. 2B are diagrams helpful in illustrating delay calculations with respect to a simple two-input gate.
Figure 2B:
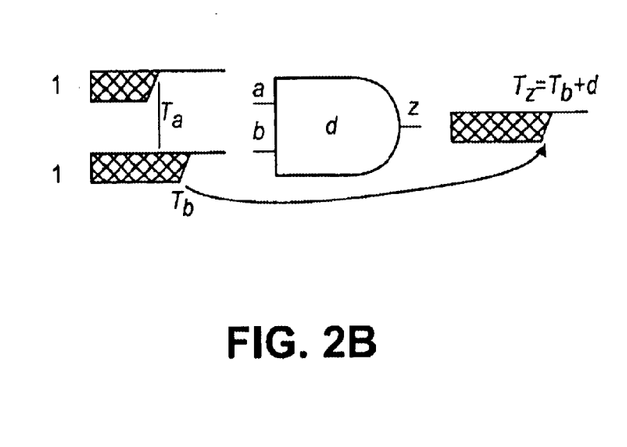

Examples of event propagation using principles of "controlling" and "non-controlling" values are illustrated in FIGS. 2A and 2B, for the simple case of a two-input AND gate. A controlling value (CV) at a gate input is one that determines the output of the gate regardless of the values of the other inputs. A non-controlling value (NCV) does not change the gate output by itself. For an AND gate, the controlling and non-controlling values are 0 and 1, respectively. The arrival time of a gate output is determined by the earliest input with a controlling value, if it exists; otherwise, the latest input with the non-controlling value determines the output arrival time. In FIG. 2A, input "a" is a controlling value because it will eventually become 0, whereas in FIG. 2B, neither input "a" nor "b" is a controlling value because both will stay at 1. Because, input "a" has a controlling value in FIG. 2A, the gate output arrival time "$T_z$" is determined only by the arrival time $T_a$ of input "a", plus the gate delay d. In FIG. 2B, however, because neither input "a" nor "b" has a controlling value, the output arrival time $T_z$ is given by the latest input arrival time (in this example, $T_b$) plus the gate delay d. Because the last arriving event at any node determines the delay up to that node, the terms "arrival time" and "delay" are used interchangeably herein.

For a generic gate having inputs "a" and "b" and output "z" in floating mode (FM), these concepts may be shown in the form of a truth table, $T_z^{FM}$, such as appearing in Table 1 below.

TABLE 1

| $v_a$ | $v_b$ | $T_z^{FM}$ |
|---|---|---|
| CV | CV | $\min(T_a,T_b) + d$ |
| CV | NCV | $T_a + d$ |
| NCV | CV | $T_b + d$ |
| NCV | NCV | $\max(T_a,T_b) + d$ |

It is possible to write a logical expression (or predicate) that describes whether an input event propagates from a gate input to the gate output; such expressions are sometimes referred to as "sensitization conditions" or "propagation conditions." Referring back to FIGS. 2A and 2B, the sensitization condition for the path from input "a" to gate output "z" may be denoted $COND_{az}$. In FIG. 2A, analyzing the path of the gate using floating mode propagation condition, the path is "sensitized," so $COND_{az}$ is 1 (true). In FIG. 2B, again analyzing the path of the gate using floating mode propagation condition, the path is not "sensitized," so $COND_{az}$ is 0 (false). A number of propagation conditions have been proposed. Two such propagation conditions, referred to as "viability" and "floating-mode condition," have been used in calculating the floating-mode arrival time of Table 1. The values of $T_z^{FM}$ shown in Table 1 are the least pessimistic that can be achieved in "floating mode." Thus, for any conditional expression $T_z^X$ to be correct for delay calculation using the conventional "floating mode" conditional analysis, it must exceed the delay values expressed in Table 1 above; that is, it must satisfy the relationship:

$$T_z^x \geq T_z^{FM} \forall v_a, \forall v_b$$

Several other propagation conditions have been proposed. "Static sensitization" is a commonly used sensitization condition that has arisen from test generation. Static sensitization is based on the premise that a path is "sensitized" only if all its side inputs (i.e., inputs of a gate that are not on the delay path) have non-controlling values. A computational advantage of this condition is that it depends only on the final (stable) values of the inputs and is independent of the input event times. However, a drawback of static sensitization techniques is that, if the two inputs of a gate are controlling, they incorrectly assume that the paths from both inputs are false.

In contrast to static sensitization, the simplest (but most pessimistic) path propagation condition is that of topological analysis where events always propagate. Thus, for the two-input gate case, the output arrival time, which may be designated $T_z^{TOP}$, is always the maximum of the input event times plus the gate delay. Table 2 below summarizes and compares the arrival times for floating mode, static sensitization, and topological analysis.

TABLE 2

| $v_a$ | $v_b$ | $T_z^{FM}$ | $T_z^{ST}$ | $T_z^{TOP}$ |
|---|---|---|---|---|
| CV | CV | $\min(T_a,T_b) + d$ | $-\infty$ | $\max(T_a,T_b) + d$ |
| CV | NCV | $T_a + d$ | $T_a + d$ | $\max(T_a,T_b) + d$ |
| NCV | CV | $T_b + d$ | $T_b + d$ | $\max(T_a,T_b) + d$ |
| NCV | NCV | $\max(T_a,T_b) + d$ | $\max(T_a,T_b) + d$ | $\max(T_a,T_b) + d$ |

In Table 2, the term "$-\infty$" indicates that no event propagates; hence, an effectively "infinite" delay. As may be observed from viewing Table 2, the output arrival time $T_z^{TOP}$ under a topological analysis where events always propagate is always greater than or equal to the output arrival time $T_z^{FM}$ using floating mode conditional analysis. Topological analysis is commonly used in static timing analysis tools. A big disadvantage is its failure to detect any false paths, leading to overly pessimistic results.

Therefore, a need exists for a functional timing analysis of circuit blocks that has improved accuracy, yet is not computationally burdensome.

Accordingly, the present invention provides for a method and mechanism for performing improved timing analysis on virtual component blocks. In an embodiment, a method of analyzing timing in a circuit block, where the circuit block includes a plurality of inputs and one or more outputs, and where the plurality of inputs divided into a set of one or more data inputs and a set of one or more control inputs, includes (a) identifying a set of modes, each of the modes corresponding to a unique combination of control input values for the circuit block; (b) applying the combination of control input values for one of said modes to the circuit block; (c) for each data input, calculating a first delay for each data input/output path not passing through a blocked circuit node for the applied combination of control input values using a first propagation condition; (d) for each control input, calculating a second delay for each control input/output path not passing through a blocked circuit node for the applied combination of control input values using a second propagation condition; and (e) repeating steps (b) through (d) for each of the remaining modes within the set of modes. Further details of aspects, objects, and advantages of the invention are described below in the detailed description, drawings, and claims.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Aspects of the present invention advantageously provide for performing improved timing analysis on virtual circuit blocks. One embodiment of the invention shall now be presented with reference to FIG. 3, which is a flow-chart 300 illustrating the steps of performing improved timing analysis according to an embodiment of the invention. Initially, for a given circuit block, a set of modes are identified in step 310. A mode of a circuit block is a functionally meaningful combination of control input values. For example, the circuit block of FIG. 1 would have three modes, because the circuit block may operate to perform three distinct operations based upon the control input values 60. Note that it is often the case that various combinations of control inputs are not utilized in the operation of a circuit block, and this information can be useful in eliminating delay calculations that, due to the functionality of the circuit, will never occur in normal operation. In practice, the set of modes for a circuit block may identified by information publicly available about the components in a circuit block. A designer of a circuit block may gain access to the modes of the circuit block by consulting a specification for the components of the circuit block. For example, for an ALU (arithmetic logic unit), the modes are publicly known and available.

Figure 3:
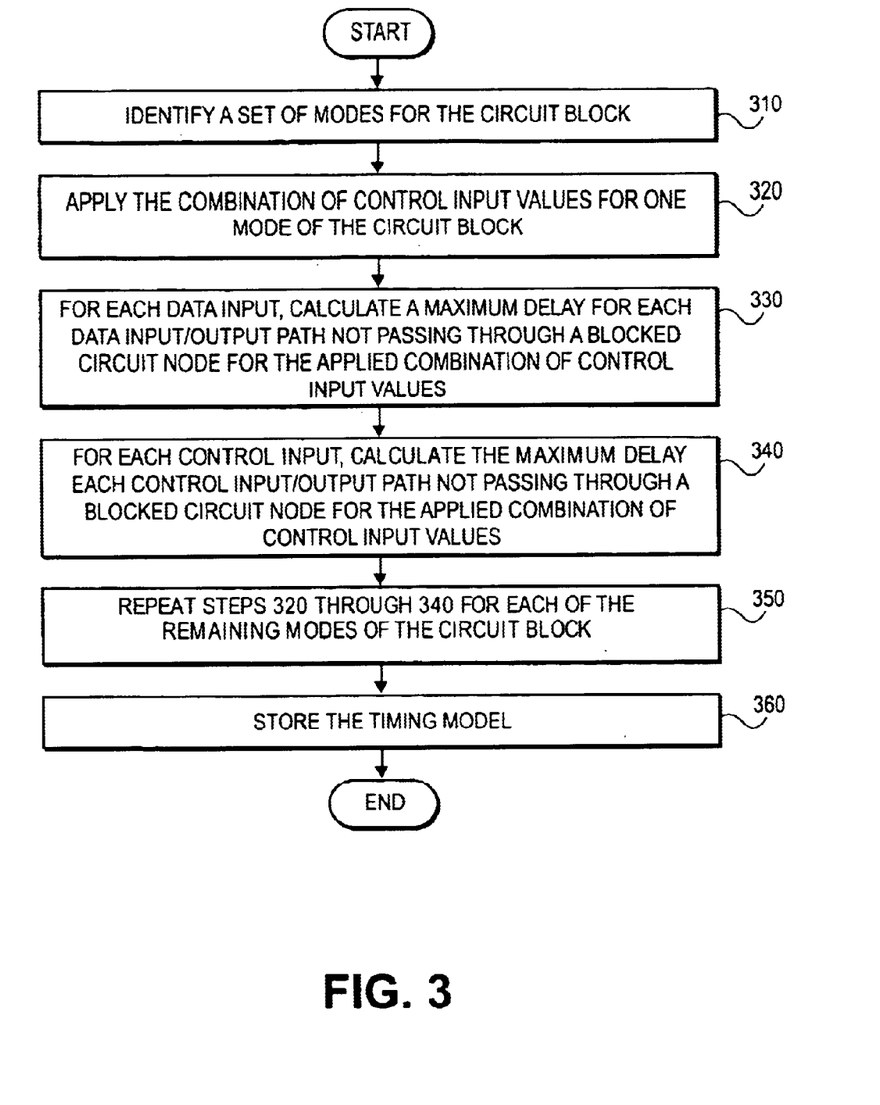
FIG. 3 is a flow-chart 300 illustrating the steps of performing improved timing analysis according to an embodiment of the invention.
Figure 4:
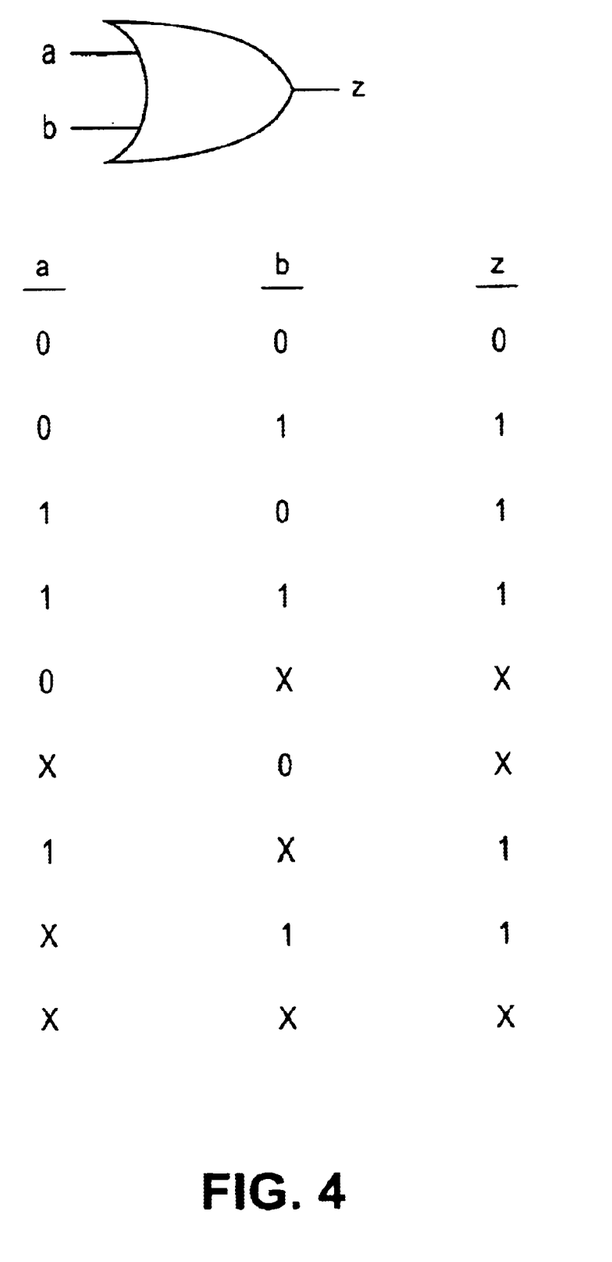
FIG. 4 is a graphical illustration of the situations when a constant may be propagated through a two-input AND gate according to an embodiment of the invention.

After the set of modes are identified for the circuit block, the combination of control input values for one of the modes in applied to the circuit block in step 320. The combination of control input values are applied by propagating a constant as far as possible. In other words, a constant value is said to propagate when the output of a gate may be determined in view of one or more constant input values. For example, if a single input of "1" is propagated to a two-input OR gate, then the output may be determined to be a "1." On the other hand, if a single input of "1" is propagated to a two-input AND gate, then the output may not be determined, as the other input value is necessary to determine the output value. For illustrative purposes, FIG. 4 provides a graphical illustration of the situations when a constant may be propagated through a two-input OR gate. The techniques of determining if a constant may propagate through a circuit block are well-known to those in the art.

Thereafter, in step 330, for each data input, a maximum delay for each data input/output path not passing through a blocked circuit node for the applied combination of control input values is calculated. In an embodiment, step 330 may be performed using a propagation condition known as static sensitization. Using static sensitization, a data input/output path passes through a blocked circuit node when a controlling value in the data input/output path has propagated to a gate's side inputs (i.e., inputs not on the data path). For example, if one input of an AND gate is 0, the paths from the its other inputs will be blocked. The maximum delay may be calculated by performing topological analysis on the unblocked portions of the circuit block.

Subsequently, in step 340, for each control input, a maximum delay for each control input/output path not passing through a blocked circuit node for the applied combination of control input values is calculated. Paths are traced to determine the worst case path for each control input/output pair. Paths are traced for each path using a propagation condition to determine if it is a false path using well-known techniques. A propagation condition is a logical expression (or predicate) that describes whether an input event propagates from a gate input to the gate output. There are a variety of propagation conditions known in the art, including viability, safe static, static co-sensitization, and the Brand-Iyengar condition.

Figure 5:
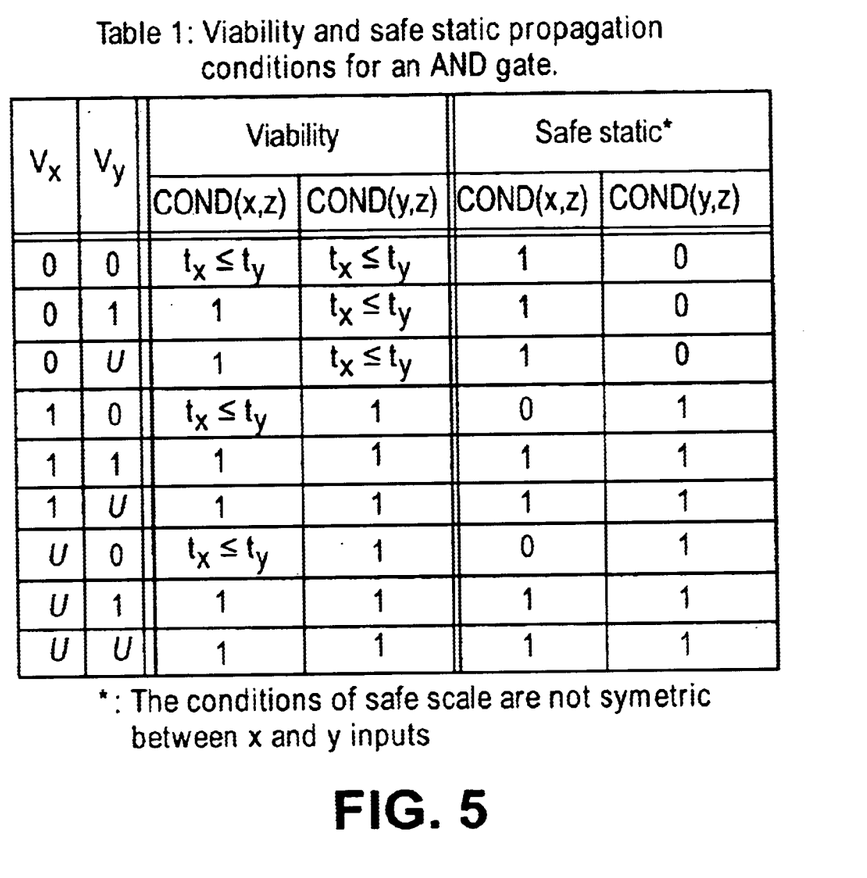
FIG. 5 is a table 500 illustrating the propagation conditions for an AND gate with inputs x and y and output z for viability and safe static propagation conditions according to an embodiment of the invention.

For illustrative purposes, the propagation conditions for an AND gate with inputs x and y and output z for viability and safe static propagation conditions are provided in the table 400 of FIG. 5. In table 500, $v_x$ and $v_y$ are the stable logic values of the inputs, with U being an unknown value, and $t_x$ and $t_y$ are the input arrival times. COND(x,z) and COND(y,z) denote, respectively, whether an event or transition on input x and y can propagate to the output z. Note that in the case of viability, the conditions depend on the input arrival times $t_x$ and $t_y$. For example, when both inputs are 0, which is the controlling value for AND, the event on input x can propagate only if it arrives no later than input y, hence COND(x,z)=$t_x \leq t_y$. Other propagation conditions, e.g., static co-sensitization and Brand-Iyengar, may also be used be embodiments of the invention in propagating values for the control inputs in step 320. Accordingly, as any propagation condition may be utilized by embodiments, it is contemplated that other propagation conditions, whether mentioned here or later developed, may be used by embodiments of the invention.

Next, in step 350, steps 320 through 340 are repeated for each of the remained modes of the circuit block identified in step 310. Thus, all data input/output pairs and all control input/output pairs are processed and analyzed.

Finally, the timing delays obtained in steps 310 through 350 are stored in a timing model in step 360. A timing model is an expression of timing information for control input paths and data input paths for each mode of a circuit block. A timing model may be stored in a computer system 600. The timing model should not yield more optimistic timing characterizations than the actual circuit block.

The timing model may be used to characterize the timing of a circuit block without having access to the actual circuit block once the timing model is constructed. This may be advantageous when a developer of a circuit block does not wish to reveal details about the contents of the circuit block, but does wish to make it available to others for use in their system. A timing model may also be employed advantageously for efficiency reasons for instance, when the circuit block is instantiated more than once. In an embodiment, the timing model may store information about, for each mode, the longest delay of the control input/output paths which are not false paths and the longest delay of the data input/output paths which are not false paths. In another embodiment, the timing model may store information about, for each mode, the delay of all control input/output paths and all data input/output paths. Accordingly, the timing model may be configured such that different levels of information are stored, i.e., the amount of information stored about the delay of control input/output paths and data input/output paths is configurable. The delay analysis information stored in the timing model may account for different input slews and load capacitances, and the results may be expressed in tabular or matrix form. For example, the timing model may be express the timing delays as m*n matrices of a scalar quantity. The timing models may be used to verify the timing of the circuit block once obtained.

Figure 6A:
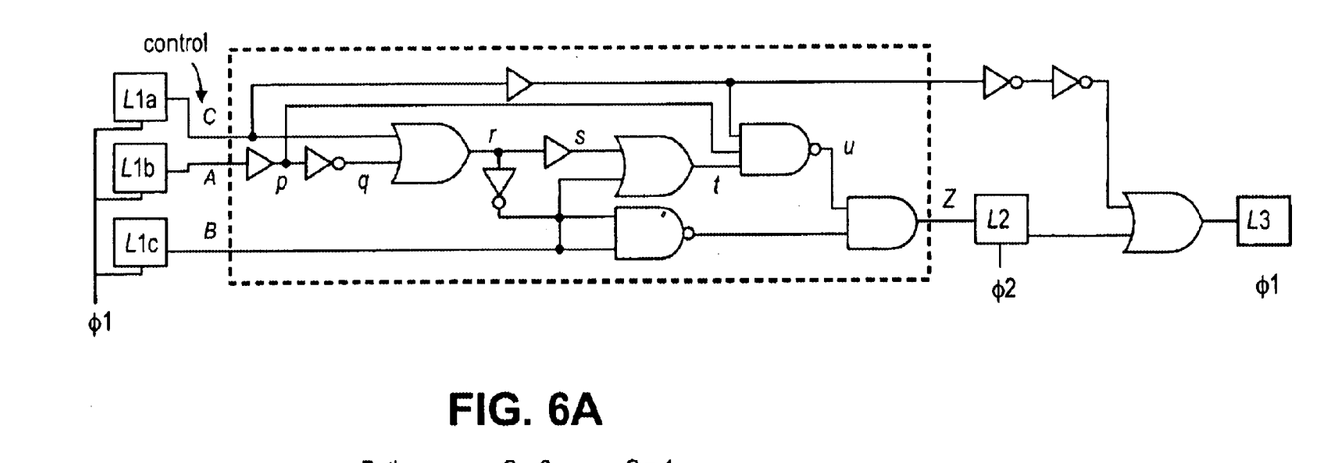
FIG. 6A is a graphical depiction of a circuit block which shall be used in describing the operation of an embodiment of the invention.
Figure 6B:
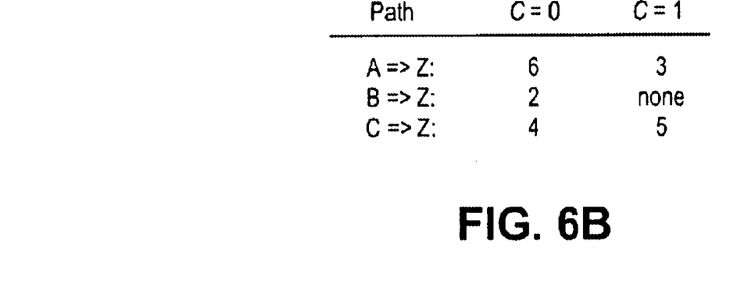
FIG. 6B is a graphical depiction of a timing model for the circuit block illustrated in FIG. 6A according to an embodiment of the invention.

To further illustrate aspects of the invention, an illustrative example of an embodiment will be presented with reference to FIG. 6A, which is a graphical depiction of a simple circuit block. Note that embodiments may be deployed upon circuit blocks of varying complexity, so the circuit block in FIG. 6A is merely illustrative. FIG. 6B is a graphical depiction of a timing model for the circuit block illustrated in FIG. 6A according to an embodiment of the invention. The timing model depicted in FIG. 6B is also simplified to avoid complicating the explanation; in practice, the timing model may be more complex, e.g., information characterizing the delay of a data input/output path or control input/output path may be stored in a matrix. Also, the timing values in FIG. 6B have been expressed as whole numbers for illustration purposes; in practice, the timing values are very small units of time and are not whole numbers.

In FIG. 6B, note that in the mode wherein C=0, the path delay for C=>Z is 4, rather than 5. This is so because path C-r-s-t-u-Z of delay 5 is a false path due to COND(t,u)=0, which is so for both viability and safe static propagation conditions, because input t of gate u has an unknown value while the top input has a controlling value and arrives earlier. Calculating a more accurate delay for path C=>Z can make a substantial impact on the output timing. Consider the output arrival time for mode C=0. Given the arrival time of 0, 0, 2 for inputs A, B, C, respectively, the output arrival time would be calculated as 7 ignoring false paths from control inputs, while according to embodiments of the invention it would be 6, which is 14% faster.

Figure 7A:
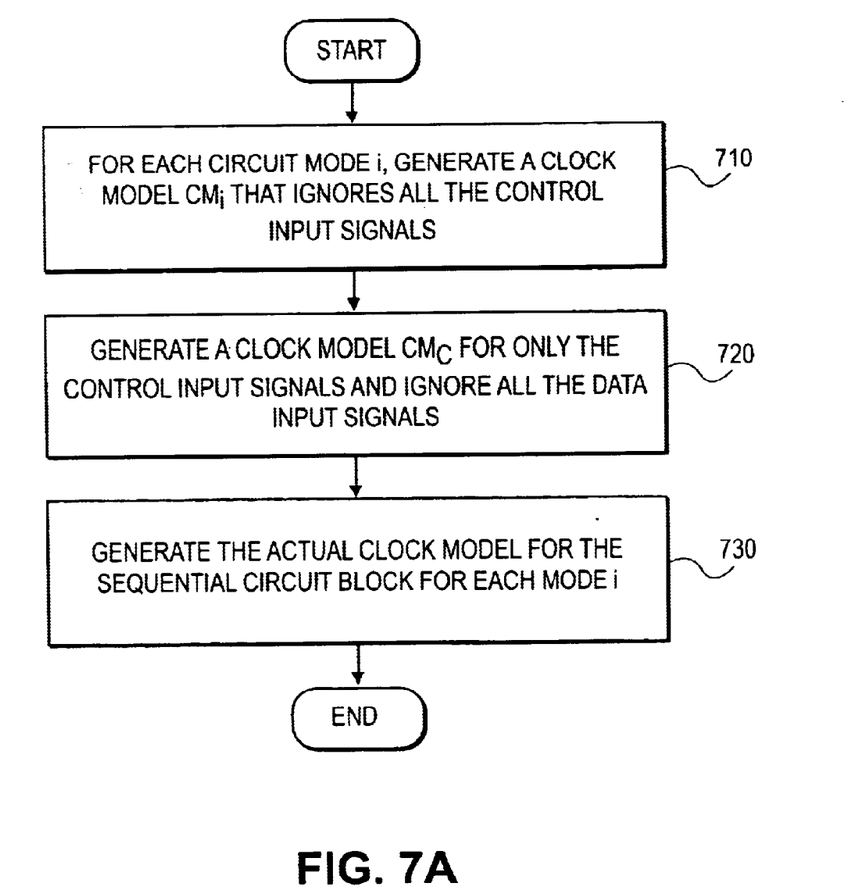
FIG. 7A is a flow-chart illustrating the sequence of steps in performing improved timing analysis upon sequential circuit blocks according to embodiments of the invention.

Embodiments of the invention may be used to perform improved timing analysis upon sequential circuit blocks. A sequential circuit block is a circuit block containing one or more flip-flops and/or latches. A distinct timing model may be generated for each mode of the sequential circuit block to accurately capture the timing constraints of the sequential circuit block. The creation of a timing model for sequential circuits requires consideration of the setup/hold requirements for latches and flip-flops within the circuit block. In response, embodiments create mode-dependant timing models for sequential circuit blocks between synchronizers and make all synchronizers visible at higher levels where they may be handled explicitly. The sequence of steps performed by an embodiment to perform improved timing analysis upon sequential circuit blocks shall now be described with reference to FIG. 7A, which is a flow-chart illustrating the same. Initially, in step 710, for each circuit mode i, generate a clock model $CM_i$ that ignores all the control input signals. Next, in step 720, generate a clock model $CM_c$ for only the control input signals and ignore all the data input signals. Step 720 may be performed in accordance with embodiment of the invention. Finally, in step 730, the actual clock model for the sequential circuit block for each mode i is calculated by determining the mathematical union of $CM_i$ and $CM_c$. The mode-dependent clock model of the sequential circuit may provide a more accurate assessment of timing delays for the sequential circuit than prior approaches.

Figure 7B:
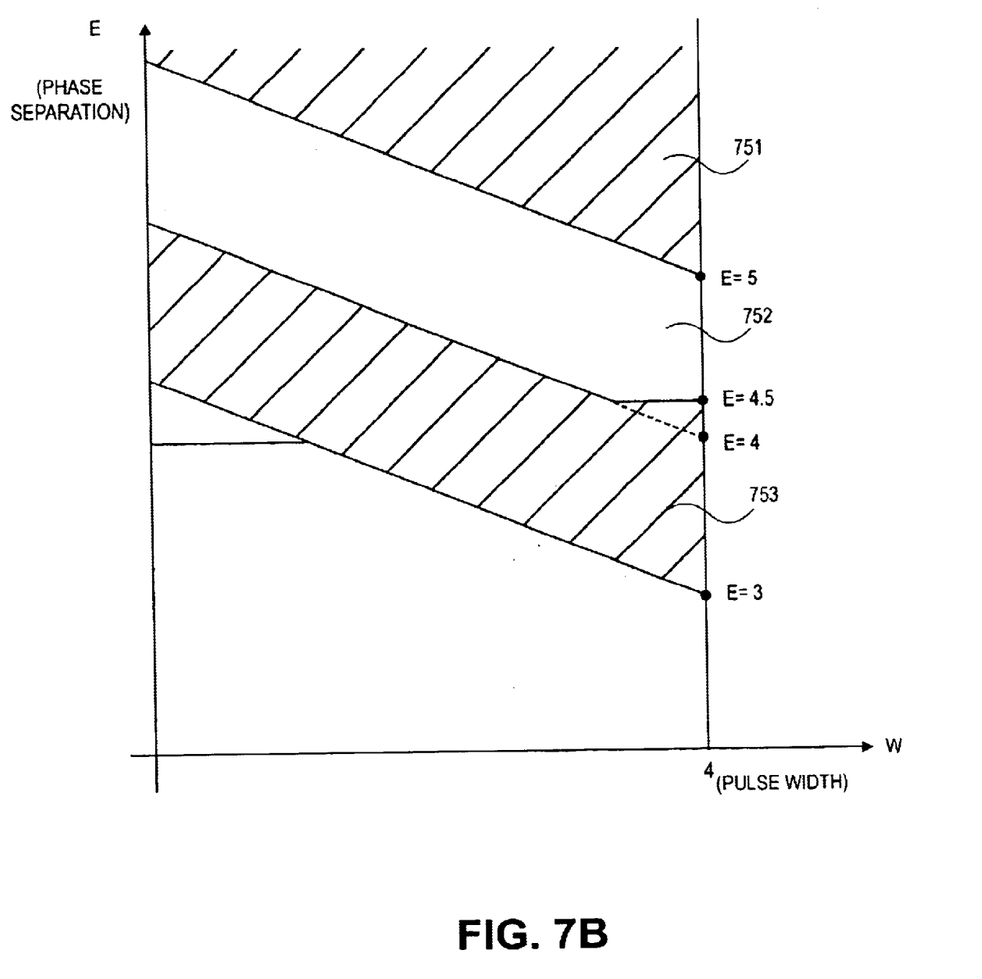
FIG. 7B is a graphical depiction of the improvement of the timing analysis for a two mode sequential circuit block according to an embodiment of the invention.

As embodiments of the invention calculate more accurate delays for the control input paths, the clock model generated for a sequential circuit block is more accurate than prior methods. FIG. 7B is a graphical depiction of the improvement of the timing analysis for a two mode sequential circuit block according to an embodiment of the invention. In FIG. 7B, E and W are clock parameters, where E is the spacing of the clock signal, and W is the pulse width of the clock. Area 751 on FIG. 7B represents the set of correct clock parameters (E,W) using prior art methods of generating timing models. As suggested by FIG. 7B, area 751 may be too conservative. Area 752 indicates the set of correct clock parameters (E,W) for a first mode of the sequential circuit block according to an embodiment of the invention, and area 753 indicates the set of correct clock parameters (E,W) for a second mode of the sequential circuit block according to an embodiment of the invention. Note that the minimum cycle time for mode C=1 reduces to 2E=6, which is 40% less than the value computed using topological analysis. Thus, embodiments of the invention may improve the accuracy clock models. As many prior approaches to performing timing analysis do not consider the different modes of a sequential circuit block into, the most restrictive timing model must be used for all modes. As FIG. 7B shows, the accuracy of the timing model may be improved through embodiments of the invention.

Embodiments of the invention may be used to analyze timing delays for circuit blocks. The description of embodiments of the invention herein have been explained with reference to a calculating the maximum delay for the circuit block for ease of explanation. Embodiments of the invention may also be employed to calculate a minimum delay for the circuit block, or any delay for the circuit block between the maximum delay and the minimum delay for the circuit block. Accordingly, the timing analysis performed by embodiments of the invention are may perform a variety of timing measures, including, but not limited to, determining the maximum delay of a circuit block and the minimum delay of the circuit block.

The execution of the sequences of instructions required to practice the invention may be performed in embodiments of the invention by a computer system 800. In an embodiment of the invention, execution of the sequences of instructions required to practice the invention is performed by a single computer system 800. According to other embodiments of the invention, two or more computer systems 800 coupled by a communication link 815 may perform the sequence of instructions required to practice the invention in coordination with one another. In order to avoid needlessly obscuring the invention, a description of only one computer system 800 will be presented below; however, it should be understood that any number of computer systems 600 may be employed to practice the invention.

Figure 8:
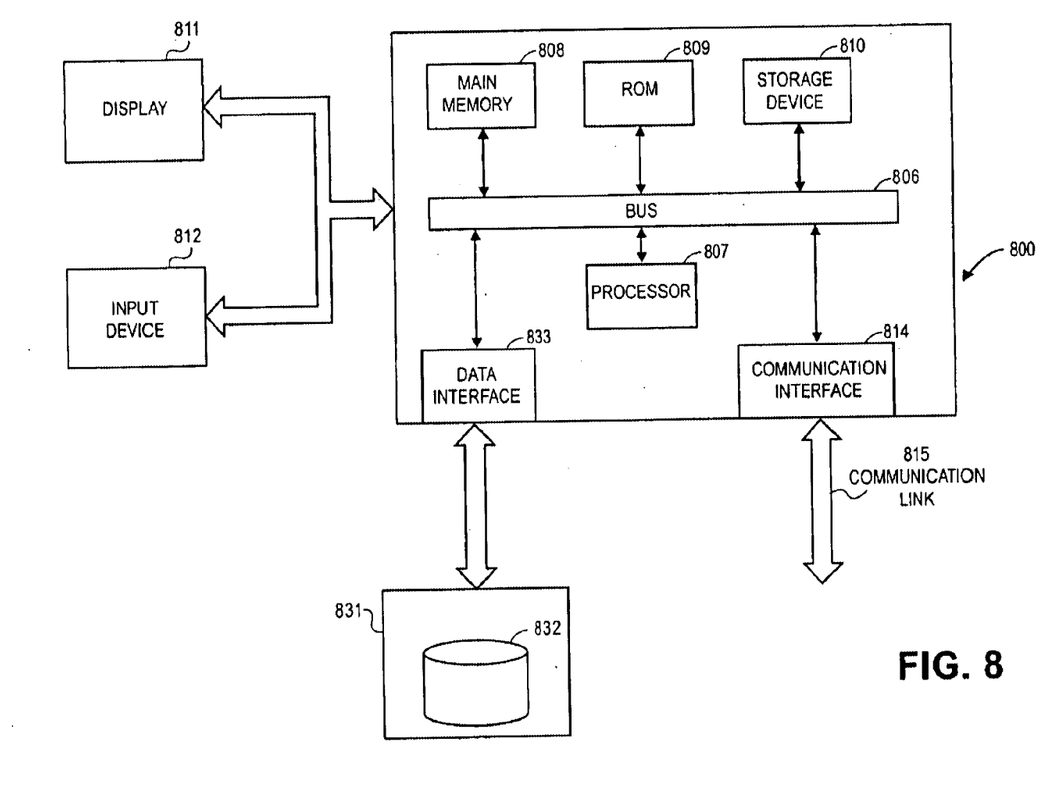
FIG. 8 is a block diagram of the functional components of a computer system 800 according to an embodiment of the invention.

A computer system 800 according to an embodiment of the invention will now be described with reference to FIG. 8., which is a block diagram of the functional components of a computer system 800 according to an embodiment of the invention. As used herein, the term computer system 800 is broadly used to describe any computer that can store and independently run one or more programs, e.g., a personal computer, a server computer, a portable laptop computer, or a personal data assistants ("PDA").

Each computer system 800 may include a communication interface 814 coupled to the bus 806. The communication interface 814 provides two-way communication between computer systems 800. The communication interface 814 of a respective computer system 800 transmits and receives electrical, electromagnetic or optical signals that include data streams representing various types of information, including instructions, messages and data. A communication link 815 links one computer system 800 with another computer system 800. The communication link 815 may be a LAN, in which case the communication interface 814 may be a LAN card. Alternatively, the communication link 815 may be a PSTN, in which case the communication interface 814 may be an integrated services digital network (ISDN) card or a modem. Also, as a further alternative, the communication link 815 may be a wireless network.

A computer system 800 may transmit and receive messages, data, and instructions, including program, i.e., application, code, through its respective communication link 815 and communication interface 814. Received program code may be executed by the respective processor(s) 807 as it is received, and/or stored in the storage device 810, or other associated non-volatile media, for later execution. In this manner, a computer system 800 may receive messages, data and/or program code in the form of a carrier wave.

In an embodiment, the computer system 800 operates in conjunction with a data storage system 831, wherein the data storage system 831 contains a database 832 that is readily accessible by the computer system 800. In alternative embodiments, the database 832 may be stored on another computer system 800, e.g., in a memory chip and/or hard disk. In yet alternative embodiments, the database 832 may be read by the computer system 800 from one or more floppy disks, CD-ROMs, or any other medium from which a computer can read. In an alternative embodiment, the computer system 800 can access two or more databases 832, stored in a variety of mediums, as previously discussed.

A computer system 800 includes a bus 806 or other communication mechanism for communicating instructions, messages and data, collectively, information, and one or more processors 807 coupled with the bus 806 for processing information. A computer system 800 also includes a main memory 808, such as a random access memory (RAM) or other dynamic storage device, coupled to the bus 806 for storing dynamic data and instructions to be executed by the processor(s) 807. The main memory 808 also may be used for storing temporary data, i.e., variables, or other intermediate information during execution of instructions by the processor(s) 807.

A computer system 800 may further include a read only memory (ROM) 809 or other static storage device coupled to the bus 806 for storing static data and instructions for the processor(s) 807. A storage device 810, such as a magnetic disk or optical disk, may also be provided and coupled to the bus 806 for storing data and instructions for the processor(s) 807.

A computer system 800 may be coupled via the bus 806 to a display device 811, such as, but not limited to, a cathode ray tube (CRT), for displaying information to a user. An input device 812, including alphanumeric and other keys, is coupled to the bus 806 for communicating information and command selections to the processor(s) 807. Another type of user input device may include a cursor control 813, such as, but not limited to, a mouse, a trackball, a fingerpad, or cursor direction keys, for communicating direction information and command selections to the processor(s) 807 and for controlling cursor movement on the display 811.

According to one embodiment of the invention, an individual computer system 800 performs specific operations by their respective processor(s) 807 executing one or more sequences of one or more instructions contained in the main memory 808. Such instructions may be read into the main memory 808 from another computer-usable medium, such as the ROM 809 or the storage device 810. Execution of the sequences of instructions contained in the main memory 808 causes the processor(s) 807 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 807. Such a medium may take many forms, including, but not limited to, non-volatile, volatile and transmission media. Non-volatile media, i.e., media that can retain information in the absence of power, includes the ROM 809. Volatile media, i.e., media that can not retain information in the absence of power, includes the main memory 808. Transmission media includes coaxial cables, copper wire and fiber optics, including the wires that comprise the bus 806. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

Various forms of computer-usable media may be involved in providing one or more sequences of one or more instructions to the processor(s) 807 for execution. For example, the instructions may initially be provided on a magnetic disk of an external computer system 800 (not shown). The external computer system 800 may load the instructions into its dynamic memory and then transit them over a telephone line, using a modem. A modem coupled to the local computer system 800 may receive the instructions on a telephone line and use an infrared transmitter to convert the instruction signals transmitted over the telephone line to corresponding infrared signals. An infrared detector (not shown) coupled to the bus 806 may receive the infrared signals and place the instructions therein on the bus 806. The bus 806 may carry the instructions to the main memory 808, from which the processor(s) 807 thereafter retrieves and executes the instructions. The instructions received by the main memory 808 may optionally be stored on the storage device 810, either before or after their execution by the processor(s) 807.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

What is claimed is:

1. A method of analyzing timing in a circuit block, said circuit block including a plurality of inputs and a plurality of outputs, said plurality of inputs divided into a set of one or more data inputs and a set of one or more control inputs, said method comprising:

(a) identifying a set of modes, each of said modes corresponding to a unique combination of control input values for the circuit block;

(b) applying the combination of control input values for one of said modes to the circuit block;

(c) for each data input, calculating a first delay for each data input/output path not passing through a blocked circuit node for the applied-combination of control input values using a first propagation condition;

(d) for each control input, calculating a second delay for each control input/output path not passing through a blocked circuit node for the applied combination of control input values using a second propagation condition; and (e) repeating steps (b) through (d) for each of the remaining modes within the set of modes.

2. The method of claim 1, wherein the second propagation condition is one member selected from the group consisting of viability, safe static, static co-sensitization, and the Brand-Iyengar condition.

3. The method of claim 1, further comprising:

(f) storing a timing model, wherein the timing model comprises information about, for each mode, the first delay and the second delay.

4. The method of claim 3, wherein the timing model comprises information about the maximum delay of the first delay, the maximum delay of the second delay, the minimum delay of the first delay, and the minimum delay of the second delay.

5. The method of claim 3, further comprising analyzing the timing of a virtual component block using the timing model.

6. The method of claim 1, wherein step (b) comprises propagating a constant for each control input value.

7. The method of claim 1, wherein the first propagation condition is static sensitization.

8. The method of claim 1, wherein one or more false paths are excluded from the calculation of the first delay or the calculation of the second delay.

9. The method of claim 1, further comprising:

(f) verifying the timing of the circuit block using the set of first delays and the set of second delays calculated in step (c) and step (d).

10. The method of claim 9, wherein the second delay is less pessimistic than topological delay.

11. The method of claim 1, wherein the first delay and the second delay are m*n matrices of a scalar quantity.

12. The method of claim 1, wherein the first delay is a maximum delay for each data input/output path and the second delay is a maximum delay for each control input/output path.

13. The method of claim 1, wherein the first delay is a minimum delay for each data input/output path and the second delay is a minimum delay for each control input/output path.

14. The method of claim 1, wherein the circuit block is a sequential circuit block, further comprising:

(f) calculating a clock model using the set of first delays and the set of second delays calculated in step (c) and step (d).

15. The method of claim 14, further comprising:

(g) storing the clock model.

16. A computer-readable medium carrying one or more sequences of instructions for analyzing timing in a circuit block, said circuit block including a plurality of inputs and a plurality of outputs, said plurality of inputs divided into a set of one or more data inputs and a set of one or more control inputs, wherein execution of the one or more sequences of instructions by one or more processors causes the one or more processors to perform a method comprising:

(a) identify a set of modes, each of said modes corresponding to a unique combination of control input values for the circuit block;

(b) apply the combination of control input values for one of said modes to the circuit block;

(c) for each data input, calculate a first delay for each data input/output path not passing through a blocked circuit node for the applied combination of control input values using a first propagation condition;

(d) for each control input, calculate a second delay for each control input/output path not passing through a blocked circuit node for the applied combination of control input values using a second propagation condition; and (e) repeat steps (b) through (d) for each of the remaining modes within the set of modes.

17. The computer-readable medium of claim 16, wherein the second propagation condition is one member selected from the group consisting of viability, safe static, static co-sensitization, and the Brand-Iyengar condition.

18. The computer-readable medium of claim 16, wherein execution of the one or more sequences of instructions by one or more processors further causes the one or more processors to:

(f) store a timing model, wherein the timing model comprises information about, for each mode, the first delay and the second delay.

19. The computer-readable medium of claim 18, wherein the timing model comprises information about the maximum delay of the first delay, the maximum delay of the second delay, the minimum delay of the first delay, and the minimum delay of the second delay.

20. The computer-readable medium of claim 18, wherein execution of the one or more sequences of instructions by one or more processors further causes the one or more processors to analyze the timing of a virtual component block using the timing model.

21. The computer-readable medium of claim 16, wherein step (b) comprises propagating a constant for each control input value.

22. The computer-readable medium of claim 16, wherein the first propagation condition is static sensitization.

23. The computer-readable medium of claim 16, wherein one or more false paths are excluded from the calculation of the first delay or the calculation of the second delay.

24. The computer-readable medium of claim 16, wherein execution of the one or more sequences of instructions by one or more processors further causes the one or more processors to:

(f) verify the timing of the circuit block using the set of first delays and the set of second delays calculated in step (c) and step (d).

25. The computer-readable medium of claim 24, wherein the second delay is less pessimistic than topological delay.

26. The computer-readable medium of claim 16, wherein the first delay and the second delay are m*n matrices of a scalar quantity.

27. The computer-readable medium of claim 16, wherein the first delay is a maximum delay for each data input/output path and the second delay is a maximum delay for each control input/output path.

28. The computer-readable medium of claim 16, wherein the first delay is a minimum delay for each data input/output path and the second delay is a minimum delay for each control input/output path.

29. The computer-readable medium of claim 16, wherein the circuit block is a sequential circuit block, and wherein execution of the one or more sequences of instructions by one or more processors further causes the one or more processors to:
(f) calculate a clock model using the set of first delays and the set of second delays calculated in step (c) and step (d).

30. The computer-readable medium of claim 29, wherein execution of the one or more sequences of instructions by one or more processors further causes the one or more processors to:
(g) store the clock model.

31. An apparatus for analyzing timing in a circuit block, said circuit block including a plurality of inputs and a plurality of outputs, said plurality of inputs divided into a set of one or more data inputs and a set of one or more control outputs, said apparatus comprising:
means for identifying a set of modes, each of said modes corresponding to a unique combination of control input values for the circuit block;
means for applying the combination of control input values for one of said modes to the circuit block;
means for calculating, for each data input, a first delay for each data input/output path not passing through a blocked circuit node for the applied combination of control input values using a first propagation condition; and
means for calculating, for each control input, a second delay for each control input/output path not passing through a blocked circuit node for the applied combination of control input values using a second propagation condition.

32. The apparatus of claim 31, wherein the second propagation condition is one member selected from the group consisting of: viability, safe static, static co-sensitization, and the Brand-Inyengar condition.

33. The apparatus of claim 31, further comprising:
means for storing a timing model, wherein the timing model comprises information about, for each mode, the first delay and the second delay.

34. The apparatus of claim 33, wherein the timing model comprises information about the maximum delay of the first delay, the maximum delay of the second delay, the minimum delay of the first delay, and the minimum delay of the second delay.

35. The apparatus of claim 31, wherein said means for applying the combination of control input values for one of said modes to the circuit block comprises means for propagating a constant for each control input value.

36. The apparatus of claim 31, wherein the first propagation condition is static sensitization.

37. The apparatus of claim 31, wherein one or more false paths are excluded from the calculations of the first delay or the claculation of the second delay.

38. The apparatus of claim 31, further comprising:
means for verifying the timing of the circuit block using the set of first delays and the set of second delays.

39. The apparatus of claim 38, wherein the second delay is less pessimistic than topological delay.

40. The apparatus of claim 31, wherein the first delay and the second delay are m*n matrices of a scalar quantity.

41. The apparatus of claim 31, wherein the first delay is a maximum delay for each data input/output path and the second delay is a maximum delay for each control input/output path.

42. The apparatus of claim 31, wherein the first delay is a minimum delay for each data input/output path and the second delay is a minimum delay for each control input/output path.

43. The apparatus of claim 31, wherein the circuit block is a sequential circuit block, further comprising:
means for calculating a clock model using the set of first delays and the set of second delays.

44. The apparatus of claim 43, further comprising:
means for storing the clock model.

45. The apparatus of claim 31, wherein the circuit block is sequential, the apparatus further comprising:
means for generating a mode-dependent clock model of the sequential circuit.

46. The apparatus of claim 45, wherein said means for generating the mode-dependent clock model further comprises:
means for generating, for each mode i, a clock model $CM_i$ that ignores the control input signals;
means for generating a clock model $CM_c$ that ignores the data input signals; and
means for determining a mathematical union of the clock models $CM_i$ and $CM_c$ for each mode i.

47. The method of claim 1, wherein the circuit block is sequential, the method further comprising:
generating a mode-dependent clock model of the sequential circuit.

48. The method of claim 47, wherein generating the mode-dependent clock model further comprises:
generating, for each mode i, a clock model $CM_i$ that ignores the control input signals;
generating a clock model $CM_c$ that ignores the data input signals; and
determining a mathematical union of the clock models $CM_i$ and $CM_c$ for each mode i.

* * * * *